(12) United States Patent
Beaman et al.

(10) Patent No.: US 7,771,537 B2
(45) Date of Patent: Aug. 10, 2010

(54) METHODS AND SYSTEMS FOR CONTROLLING TEMPERATURE DURING MICROFEATURE WORKPIECE PROCESSING, E.G. CVD DEPOSITION

(75) Inventors: Kevin L. Beaman, Boise, ID (US); Trung T. Doan, Vallejo, CA (US); Lyle D. Breiner, Meridian, ID (US); Ronald A. Weimer, Boise, ID (US); Er-Xuan Ping, Meridian, ID (US); David J. Kubista, Nampa, ID (US); Cem Basceri, Reston, VA (US); Lingyi A. Zheng, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 1072 days.

(21) Appl. No.: 11/418,337

(22) Filed: May 4, 2006

(65) Prior Publication Data

US 2006/0204649 A1 Sep. 14, 2006

Related U.S. Application Data

(62) Division of application No. 10/733,523, filed on Dec. 10, 2003, now Pat. No. 7,258,892.

(51) Int. Cl.
*C23C 16/00* (2006.01)
(52) U.S. Cl. ..................................... 118/725
(58) Field of Classification Search .............. 118/715, 118/724, 725
See application file for complete search history.

(56) References Cited

U.S. PATENT DOCUMENTS 579,269 A 3/1897 Hent
3,618,919 A 11/1971 Beck
3,620,934 A 11/1971 Endle (Continued)

FOREIGN PATENT DOCUMENTS

DE 198 51 824 5/2000

(Continued)

OTHER PUBLICATIONS

English Machine Translation of KR 2002-0013266. Obtained Jul. 29, 2009.*

(Continued)

*Primary Examiner*—Parviz Hassanzadeh
*Assistant Examiner*—Maureen Gramaglia
(74) *Attorney, Agent, or Firm*—Perkins Coie LLP (57) ABSTRACT

The present disclosure provides methods and systems for controlling temperature. The method has particular utility in connection with controlling temperature in a deposition process, e.g., in depositing a heat-reflective material via CVD. One exemplary embodiment provides a method that involves monitoring a first temperature outside the deposition chamber and a second temperature inside the deposition chamber. An internal temperature in the deposition chamber can be increased in accordance with a ramp profile by (a) comparing a control temperature to a target temperature, and (b) selectively delivering heat to the deposition chamber in response to a result of the comparison. The target temperature may be determined in accordance with the ramp profile, but the control temperature in one implementation alternates between the first temperature and the second temperature.

13 Claims, 4 Drawing Sheets

U.S. PATENT DOCUMENTS

| | | | |
|---|---|---|---|
| 3,630,769 A | 12/1971 | Hart et al. | |
| 3,630,881 A | 12/1971 | Lester | |
| 3,634,212 A | 1/1972 | Valayll et al. | |
| 4,018,949 A | 4/1977 | Donakowski et al. | |
| 4,242,182 A | 12/1980 | Popescu et al. | |
| 4,269,625 A | 5/1981 | Molenaar et al. | |
| 4,289,061 A | 9/1981 | Emmett | |
| 4,313,783 A | 2/1982 | Davies et al. | |
| 4,397,753 A | 8/1983 | Czaja | |
| 4,438,724 A | 3/1984 | Doehler et al. | |
| 4,469,801 A | 9/1984 | Hirai et al. | |
| 4,509,456 A | 4/1985 | Kleinert et al. | |
| 4,545,136 A | 10/1985 | Izu et al. | |
| 4,590,042 A | 5/1986 | Drage | |
| 4,593,644 A | 6/1986 | Hanak | |
| 4,681,777 A | 7/1987 | Engelken et al. | |
| 4,826,579 A | 5/1989 | Westfall | |
| 4,911,638 A | 3/1990 | Bayne et al. | |
| 4,923,715 A | 5/1990 | Matsuda et al. | |
| 4,948,979 A | 8/1990 | Munakata et al. | |
| 4,949,669 A | 8/1990 | Ishii et al. | |
| 4,966,646 A | 10/1990 | Zdeblick | |
| 4,977,106 A | 12/1990 | Smith | |
| 5,015,330 A | 5/1991 | Okumura et al. | |
| 5,017,404 A | 5/1991 | Paquet et al. | |
| 5,020,476 A | 6/1991 | Bay et al. | |
| 5,076,205 A | 12/1991 | Vowles et al. | |
| 5,090,985 A | 2/1992 | Soubeyrand | |
| 5,091,207 A | 2/1992 | Tanaka et al. | |
| 5,131,752 A | 7/1992 | Yu et al. | |
| 5,136,975 A | 8/1992 | Bartholomew et al. | |
| 5,172,849 A | 12/1992 | Barten et al. | |
| 5,200,023 A | 4/1993 | Gifford et al. | |
| 5,223,113 A | 6/1993 | Kaneko et al. | |
| 5,232,749 A | 8/1993 | Gilton | |
| 5,248,527 A | 9/1993 | Uchida et al. | |
| 5,325,020 A | 6/1994 | Campbell et al. | |
| 5,364,219 A | 11/1994 | Takahashi et al. | |
| 5,366,557 A | 11/1994 | Yu | |
| 5,377,429 A | 1/1995 | Sandhu et al. | |
| 5,380,396 A | 1/1995 | Shikida et al. | |
| 5,409,129 A | 4/1995 | Tsukada et al. | |
| 5,418,180 A | 5/1995 | Brown | |
| 5,427,666 A | 6/1995 | Mueller et al. | |
| 5,433,787 A | 7/1995 | Suzuki et al. | |
| 5,433,835 A | 7/1995 | Demaray et al. | |
| 5,445,491 A | 8/1995 | Nakagawa et al. | |
| 5,480,818 A | 1/1996 | Matsumoto et al. | |
| 5,498,292 A | 3/1996 | Ozaki et al. | |
| 5,500,256 A | 3/1996 | Watabe et al. | |
| 5,522,934 A | 6/1996 | Suzuki et al. | |
| 5,536,317 A | 7/1996 | Crain et al. | |
| 5,562,800 A | 10/1996 | Kawamura et al. | |
| 5,575,883 A | 11/1996 | Nishikawa et al. | |
| 5,589,002 A | 12/1996 | Su | |
| 5,592,581 A | 1/1997 | Okase et al. | |
| 5,595,606 A | 1/1997 | Fujikawa et al. | |
| 5,599,513 A | 2/1997 | Masaki et al. | |
| 5,624,498 A | 4/1997 | Lee et al. | |
| 5,626,936 A | 5/1997 | Alderman | |
| 5,640,751 A | 6/1997 | Faria | |
| 5,643,394 A | 7/1997 | Maydan et al. | |
| 5,654,589 A | 8/1997 | Huang et al. | |
| 5,693,288 A | 12/1997 | Nakamura | |
| 5,729,896 A | 3/1998 | Dalal et al. | |
| 5,746,434 A | 5/1998 | Boyd et al. | |
| 5,766,364 A | 6/1998 | Ishida et al. | |
| 5,769,950 A | 6/1998 | Takasu et al. | |
| 5,769,952 A | 6/1998 | Komino et al. | |
| 5,788,778 A | 8/1998 | Shang et al. | |
| 5,792,269 A | 8/1998 | Deacon et al. | |
| 5,792,700 A | 8/1998 | Turner et al. | |
| 5,819,683 A | 10/1998 | Ikeda et al. | |
| 5,820,641 A | 10/1998 | Gu et al. | |
| 5,827,370 A | 10/1998 | Gu | |
| 5,833,888 A | 11/1998 | Arya et al. | |
| 5,846,275 A | 12/1998 | Lane et al. | |
| 5,846,330 A | 12/1998 | Quirk et al. | |
| 5,851,849 A | 12/1998 | Comizzoli et al. | |
| 5,865,417 A | 2/1999 | Harris et al. | |
| 5,866,986 A | 2/1999 | Pennington | |
| 5,879,459 A | 3/1999 | Gadgil et al. | |
| 5,885,425 A | 3/1999 | Hsieh et al. | |
| 5,895,530 A | 4/1999 | Shrotriya et al. | |
| 5,902,403 A | 5/1999 | Aitani et al. | |
| 5,908,947 A | 6/1999 | Vaartstra | |
| 5,932,286 A | 8/1999 | Beinglass et al. | |
| 5,953,634 A | 9/1999 | Kajita et al. | |
| 5,956,613 A | 9/1999 | Zhao et al. | |
| 5,968,587 A | 10/1999 | Frankel | |
| 5,972,430 A | 10/1999 | DiMeo, Jr. et al. | |
| 5,994,181 A | 11/1999 | Hsieh et al. | |
| 5,997,588 A | 12/1999 | Goodwin et al. | |
| 6,006,694 A | 12/1999 | DeOrnellas et al. | |
| 6,008,086 A | 12/1999 | Schuegraf et al. | |
| 6,022,483 A | 2/2000 | Aral | |
| 6,032,923 A | 3/2000 | Biegelsen et al. | |
| 6,042,652 A | 3/2000 | Hyun et al. | |
| 6,045,620 A | 4/2000 | Tepman et al. | |
| 6,059,885 A | 5/2000 | Ohashi et al. | |
| 6,062,256 A | 5/2000 | Miller et al. | |
| 6,070,551 A | 6/2000 | Li et al. | |
| 6,079,426 A | 6/2000 | Subrahmanyam et al. | |
| 6,080,446 A | 6/2000 | Tobe et al. | |
| 6,086,677 A | 7/2000 | Umotoy et al. | |
| 6,089,543 A | 7/2000 | Freerks | |
| 6,109,206 A | 8/2000 | Maydan et al. | |
| 6,113,698 A | 9/2000 | Raaijmakers et al. | |
| 6,123,107 A | 9/2000 | Selser et al. | |
| 6,129,331 A | 10/2000 | Henning et al. | |
| 6,139,700 A | 10/2000 | Kang et al. | |
| 6,142,163 A | 11/2000 | McMillin et al. | |
| 6,143,077 A | 11/2000 | Ikeda et al. | |
| 6,143,078 A | 11/2000 | Ishikawa et al. | |
| 6,143,659 A | 11/2000 | Leem et al. | |
| 6,144,060 A | 11/2000 | Park et al. | |
| 6,149,123 A | 11/2000 | Harris et al. | |
| 6,159,298 A | 12/2000 | Saito | |
| 6,160,243 A | 12/2000 | Cozad | |
| 6,161,500 A | 12/2000 | Kopacz et al. | |
| 6,173,673 B1 | 1/2001 | Golovato et al. | |
| 6,174,366 B1 | 1/2001 | Ihantola et al. | |
| 6,174,377 B1 | 1/2001 | Doering et al. | |
| 6,174,809 B1 | 1/2001 | Kang et al. | |
| 6,178,660 B1 | 1/2001 | Emmi et al. | |
| 6,182,603 B1 | 2/2001 | Shang et al. | |
| 6,192,827 B1 | 2/2001 | Welch et al. | |
| 6,193,802 B1 | 2/2001 | Pang et al. | |
| 6,194,628 B1 | 2/2001 | Pang et al. | |
| 6,197,119 B1 | 3/2001 | Dozoretz et al. | |
| 6,200,415 B1 | 3/2001 | Maraschin | |
| 6,203,613 B1 | 3/2001 | Gates et al. | |
| 6,206,967 B1 | 3/2001 | Mak et al. | |
| 6,206,972 B1 | 3/2001 | Dunham | |
| 6,207,937 B1 | 3/2001 | Stoddard et al. | |
| 6,210,754 B1 | 4/2001 | Lu et al. | |
| 6,211,033 B1 | 4/2001 | Sandhu et al. | |
| 6,211,078 B1 | 4/2001 | Mathews | |
| 6,214,714 B1 | 4/2001 | Wang et al. | |
| 6,237,394 B1 | 5/2001 | Harris et al. | |
| 6,237,529 B1 | 5/2001 | Spahn | |
| 6,245,192 B1 | 6/2001 | Dhindsa et al. | |
| 6,251,190 B1 | 6/2001 | Mak et al. | |
| 6,255,222 B1 | 7/2001 | Xia et al. | |

| | | | | | | |
|---|---|---|---|---|---|---|
| 6,263,829 B1 | 7/2001 | Schneider et al. | | 6,634,314 B2 | 10/2003 | Hwang et al. |
| 6,270,572 B1 | 8/2001 | Kim et al. | | 6,635,965 B1 | 10/2003 | Lee et al. |
| 6,273,954 B2 | 8/2001 | Nishikawa et al. | | 6,638,672 B2 | 10/2003 | Deguchi |
| 6,277,763 B1 | 8/2001 | Kugimiya et al. | | 6,638,859 B2 | 10/2003 | Sneh et al. |
| 6,280,584 B1 | 8/2001 | Kumar et al. | | 6,638,879 B2 | 10/2003 | Hsieh et al. |
| 6,287,965 B1 | 9/2001 | Kang et al. | | 6,641,673 B2 | 11/2003 | Yang |
| 6,287,980 B1 | 9/2001 | Hanazaki et al. | | 6,656,282 B2 | 12/2003 | Kim et al. |
| 6,290,491 B1 | 9/2001 | Shahvandi et al. | | 6,663,713 B1 | 12/2003 | Robles et al. |
| 6,291,337 B1 | 9/2001 | Sidhwa | | 6,666,982 B2 | 12/2003 | Brcka |
| 6,294,394 B1 | 9/2001 | Erickson et al. | | 6,673,196 B1 | 1/2004 | Oyabu et al. |
| 6,297,539 B1 | 10/2001 | Ma et al. | | 6,686,594 B2 | 2/2004 | Ji et al. |
| 6,302,964 B1 | 10/2001 | Umotoy et al. | | 6,689,220 B1 | 2/2004 | Nguyen |
| 6,302,965 B1 | 10/2001 | Umotoy et al. | | 6,704,913 B2 | 3/2004 | Rossman |
| 6,303,953 B1 | 10/2001 | Doan et al. | | 6,705,345 B1 | 3/2004 | Bifano |
| 6,305,314 B1 | 10/2001 | Sneh et al. | | 6,706,334 B1 | 3/2004 | Kobayashi et al. |
| 6,309,161 B1 | 10/2001 | Hofmeister | | 6,716,284 B2 | 4/2004 | Campbell et al. |
| 6,315,859 B1 | 11/2001 | Donohoe | | 6,734,020 B2 | 5/2004 | Lu et al. |
| 6,321,680 B2 | 11/2001 | Cook et al. | | 6,758,911 B2 | 7/2004 | Campbell et al. |
| 6,328,803 B2 | 12/2001 | Rolfson et al. | | 6,770,145 B2 | 8/2004 | Saito et al. |
| 6,329,297 B1 | 12/2001 | Balish et al. | | 6,773,507 B2 | 8/2004 | Jallepally et al. |
| 6,333,272 B1 | 12/2001 | McMillin et al. | | 6,787,185 B2 | 9/2004 | Derderian et al. |
| 6,334,928 B1 | 1/2002 | Sekine et al. | | 6,787,463 B2 | 9/2004 | Mardian et al. |
| 6,342,277 B1 | 1/2002 | Sherman | | 6,796,316 B2 | 9/2004 | Park et al. |
| 6,346,477 B1 | 2/2002 | Kaloyeros et al. | | 6,800,172 B2 | 10/2004 | Carpenter et al. |
| 6,347,602 B2 | 2/2002 | Goto et al. | | 6,800,173 B2 | 10/2004 | Chiang et al. |
| 6,347,918 B1 | 2/2002 | Blahnik | | 6,807,971 B2 | 10/2004 | Saito et al. |
| 6,355,561 B1 | 3/2002 | Sandhu et al. | | 6,814,813 B2 | 11/2004 | Dando et al. |
| 6,358,323 B1 | 3/2002 | Schmitt et al. | | 6,818,067 B2 | 11/2004 | Doering et al. |
| 6,364,219 B1 | 4/2002 | Zimmerman et al. | | 6,818,249 B2 | 11/2004 | Derderian |
| 6,374,831 B1 | 4/2002 | Chandran et al. | | 6,820,570 B2 | 11/2004 | Kilpela et al. |
| 6,383,300 B1 | 5/2002 | Saito et al. | | 6,821,347 B2 | 11/2004 | Carpenter et al. |
| 6,387,185 B2 | 5/2002 | Doering et al. | | 6,828,218 B2 | 12/2004 | Kim et al. |
| 6,387,207 B1 | 5/2002 | Janakiraman et al. | | 6,831,315 B2 | 12/2004 | Raaijmakers et al. |
| 6,402,806 B1 | 6/2002 | Schmitt et al. | | 6,838,114 B2 | 1/2005 | Carpenter et al. |
| 6,402,849 B2 | 6/2002 | Kwag et al. | | 6,849,131 B2 | 2/2005 | Chen et al. |
| 6,415,736 B1 | 7/2002 | Hao et al. | | 6,858,264 B2 | 2/2005 | Dando et al. |
| 6,419,462 B1 | 7/2002 | Horie et al. | | 6,861,094 B2 | 3/2005 | Derderian et al. |
| 6,420,230 B1 | 7/2002 | Derderian et al. | | 6,869,500 B2 | 3/2005 | Lee et al. |
| 6,420,742 B1 | 7/2002 | Ahn et al. | | 6,881,295 B2 | 4/2005 | Nagakura et al. |
| 6,425,168 B1 | 7/2002 | Takaku et al. | | 6,884,296 B2 | 4/2005 | Basceri et al. |
| 6,428,859 B1 | 8/2002 | Chiang et al. | | 6,887,521 B2 | 5/2005 | Basceri |
| 6,432,256 B1 | 8/2002 | Raoux | | 6,890,386 B2 | 5/2005 | DeDontney et al. |
| 6,432,259 B1 | 8/2002 | Noorbakhsh et al. | | 6,905,547 B1 | 6/2005 | Londergan et al. |
| 6,432,831 B2 | 8/2002 | Dhindsa et al. | | 6,905,549 B2 | 6/2005 | Okuda et al. |
| 6,435,865 B1 | 8/2002 | Tseng et al. | | 6,916,398 B2 | 7/2005 | Chen et al. |
| 6,444,039 B1 | 9/2002 | Nguyen | | 6,926,775 B2 | 8/2005 | Carpenter et al. |
| 6,450,117 B1 | 9/2002 | Murugesh et al. | | 7,086,410 B2 | 8/2006 | Chouno et al. |
| 6,451,119 B2 | 9/2002 | Sneh et al. | | 2001/0012697 A1 | 8/2001 | Mikata |
| 6,458,416 B1 | 10/2002 | Derderian et al. | | 2001/0045187 A1 | 11/2001 | Uhlenbrock |
| 6,461,436 B1 | 10/2002 | Campbell et al. | | 2001/0050267 A1 | 12/2001 | Hwang et al. |
| 6,461,931 B1 | 10/2002 | Eldridge | | 2001/0054484 A1 | 12/2001 | Komino |
| 6,474,700 B2 | 11/2002 | Redemann et al. | | 2002/0000202 A1 | 1/2002 | Yuda et al. |
| 6,503,330 B1 | 1/2003 | Sneh et al. | | 2002/0020353 A1 | 2/2002 | Redemann et al. |
| 6,506,254 B1 | 1/2003 | Bosch et al. | | 2002/0045146 A1* | 4/2002 | Wang et al. ............ 432/49 |
| 6,507,007 B2 | 1/2003 | Van Bilsen | | 2002/0073924 A1 | 6/2002 | Chiang et al. |
| 6,509,280 B2 | 1/2003 | Choi et al. | | 2002/0076507 A1 | 6/2002 | Chiang et al. |
| 6,534,007 B1 | 3/2003 | Blonigan et al. | | 2002/0076508 A1 | 6/2002 | Chiang et al. |
| 6,534,395 B2 | 3/2003 | Werkhoven et al. | | 2002/0100418 A1 | 8/2002 | Sandhu et al. |
| 6,540,838 B2 | 4/2003 | Sneh et al. | | 2002/0104481 A1 | 8/2002 | Chiang et al. |
| 6,541,353 B1 | 4/2003 | Sandhu et al. | | 2002/0129768 A1 | 9/2002 | Carpenter et al. |
| 6,551,929 B1 | 4/2003 | Kori et al. | | 2002/0132374 A1 | 9/2002 | Basceri et al. |
| 6,562,140 B1 | 5/2003 | Bondestam et al. | | 2002/0144655 A1 | 10/2002 | Chiang et al. |
| 6,562,141 B2 | 5/2003 | Clarke | | 2002/0162506 A1 | 11/2002 | Sneh et al. |
| 6,573,184 B2 | 6/2003 | Park et al. | | 2002/0185067 A1 | 12/2002 | Upham |
| 6,579,372 B2 | 6/2003 | Park et al. | | 2002/0195056 A1 | 12/2002 | Sandhu et al. |
| 6,579,374 B2 | 6/2003 | Bondestam et al. | | 2002/0195201 A1 | 12/2002 | Beer et al. |
| 6,585,823 B1 | 7/2003 | Van Wijck | | 2002/0197402 A1 | 12/2002 | Chiang et al. |
| 6,589,868 B2 | 7/2003 | Rossman | | 2003/0000473 A1 | 1/2003 | Chae et al. |
| 6,596,085 B1 | 7/2003 | Schmitt et al. | | 2003/0003697 A1 | 1/2003 | Agarwal et al. |
| 6,602,346 B1 | 8/2003 | Gochberg et al. | | 2003/0003730 A1 | 1/2003 | Li |
| 6,613,656 B2 | 9/2003 | Li | | 2003/0023338 A1 | 1/2003 | Chin et al. |
| 6,622,104 B2 | 9/2003 | Wang et al. | | 2003/0024477 A1 | 2/2003 | Okuda et al. |
| 6,630,201 B2 | 10/2003 | Chiang et al. | | 2003/0027428 A1 | 2/2003 | Ng et al. |

| | | | | | | |
|---|---|---|---|---|---|---|
| 2003/0037730 | A1 | 2/2003 | Yamasaki et al. | KR | 2002-0013266 A * | 2/2002 |
| 2003/0049372 | A1 | 3/2003 | Cook et al. | SU | 598630 | 3/1978 |
| 2003/0066483 | A1 | 4/2003 | Lee et al. | WO | WO-98/37258 | 8/1998 |
| 2003/0070617 | A1 | 4/2003 | Kim et al. | WO | WO-99/06610 | 2/1999 |
| 2003/0070618 | A1 | 4/2003 | Campbell et al. | WO | WO-00/40772 | 7/2000 |
| 2003/0121608 | A1 | 7/2003 | Chen et al. | WO | WO-00/63952 | 10/2000 |
| 2003/0192645 | A1 | 10/2003 | Liu et al. | WO | WO-00/65649 | 11/2000 |
| 2003/0213435 | A1 | 11/2003 | Okuda et al. | WO | WO-00/79019 | 12/2000 |
| 2004/0000270 | A1 | 1/2004 | Carpenter et al. | WO | WO-01-32966 | 3/2001 |
| 2004/0003777 | A1 | 1/2004 | Carpenter et al. | WO | WO-01/46490 | 6/2001 |
| 2004/0007188 | A1 | 1/2004 | Burkhart et al. | WO | WO-02/45871 | 6/2002 |
| 2004/0025786 | A1 | 2/2004 | Kontani et al. | WO | WO-02/48427 | 6/2002 |
| 2004/0040502 | A1 | 3/2004 | Basceri et al. | WO | WO-02/073329 | 9/2002 |
| 2004/0040503 | A1 | 3/2004 | Basceri et al. | WO | WO-02/073660 | 9/2002 |
| 2004/0083959 | A1 | 5/2004 | Carpenter et al. | WO | WO-02/081771 | 10/2002 |
| 2004/0083960 | A1 | 5/2004 | Dando | WO | WO-02/095807 | 11/2002 |
| 2004/0083961 | A1 | 5/2004 | Basceri | WO | WO-03/008662 | 1/2003 |
| 2004/0089240 | A1 | 5/2004 | Dando et al. | WO | WO-03/016587 | 2/2003 |
| 2004/0099377 | A1 | 5/2004 | Newton et al. | WO | WO-03/028069 | 4/2003 |
| 2004/0124131 | A1 | 7/2004 | Aitchison et al. | WO | WO-03/033762 | 4/2003 |
| 2004/0226507 | A1 | 11/2004 | Carpenter et al. | WO | WO-03/035927 | 5/2003 |
| 2004/0238123 | A1 | 12/2004 | Becknell et al. | WO | WO-03/052807 | 6/2003 |
| 2005/0016956 | A1 | 1/2005 | Liu et al. | | | |
| 2005/0016984 | A1 | 1/2005 | Dando | | | |
| 2005/0022739 | A1 | 2/2005 | Carpenter et al. | | | |
| 2005/0028734 | A1 | 2/2005 | Carpenter et al. | | | |
| 2005/0039680 | A1 | 2/2005 | Beaman et al. | | | |
| 2005/0039686 | A1 | 2/2005 | Zheng et al. | | | |
| 2005/0045100 | A1 | 3/2005 | Derderian | | | |
| 2005/0045102 | A1 | 3/2005 | Zheng et al. | | | |
| 2005/0059261 | A1 | 3/2005 | Basceri et al. | | | |
| 2005/0061243 | A1 | 3/2005 | Sarigiannis et al. | | | |
| 2005/0081786 | A1 | 4/2005 | Kubista et al. | | | |
| 2005/0087130 | A1 | 4/2005 | Derderian | | | |
| 2005/0087302 | A1 | 4/2005 | Mardian et al. | | | |
| 2005/0120954 | A1 | 6/2005 | Carpenter et al. | | | |
| 2005/0126489 | A1 | 6/2005 | Beaman et al. | | | |
| 2005/0133161 | A1 | 6/2005 | Carpenter et al. | | | |
| 2005/0145337 | A1 | 7/2005 | Derderian et al. | | | |
| 2005/0164466 | A1 | 7/2005 | Zheng et al. | | | |
| 2005/0217575 | A1 | 10/2005 | Gealy et al. | | | |
| 2005/0217582 | A1 | 10/2005 | Kim et al. | | | |
| 2005/0249873 | A1 | 11/2005 | Sarigiannis et al. | | | |
| 2005/0249887 | A1 | 11/2005 | Dando et al. | | | |
| 2005/0268856 | A1 | 12/2005 | Miller et al. | | | |
| 2006/0134345 | A1 | 6/2006 | Rueger et al. | | | |
| 2006/0165873 | A1 | 7/2006 | Rueger et al. | | | |
| 2006/0205187 | A1 | 9/2006 | Zheng et al. | | | |
| 2006/0213440 | A1 | 9/2006 | Zheng et al. | | | |
| 2006/0237138 | A1 | 10/2006 | Qin | | | |

FOREIGN PATENT DOCUMENTS

| | | |
|---|---|---|
| EP | 1 167 569 | 1/2002 |
| JP | 63-020490 | 1/1988 |
| JP | 63-111177 | 5/1988 |
| JP | 63-256460 | 10/1988 |
| JP | 64-81311 | 3/1989 |
| JP | 1-273991 | 11/1989 |
| JP | 4-100533 | 4/1992 |
| JP | 04-213818 | 8/1992 |
| JP | 6-151558 | 5/1994 |
| JP | 06-201539 | 7/1994 |
| JP | 06-342785 | 12/1994 |
| JP | 6-342785 | 12/1994 |
| JP | 08-034678 | 2/1996 |
| JP | 9-82650 | 3/1997 |
| JP | 10-223719 | 8/1998 |
| JP | 11-172438 | 6/1999 |
| JP | 2001-82682 | 3/2001 |
| JP | 2001-261375 | 9/2001 |
| JP | 2002-164336 | 6/2002 |
| JP | 2001-254181 | 9/2002 |

OTHER PUBLICATIONS

U.S. Appl. No. 09/651,037, filed Aug. 30, 2000, Mardian.

Aera Corporation, "Fundamentals of Mass Flow Control," 1 page, retrieved from the Internet on Mar. 6, 2003, <http://www.aeramfc.com/funda.shtml>.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Cameron, Ian, "Atomic Layer Deposition Chamber Works at Low Temperatures", 2 pages, Electronic Times, Jul. 19, 2001, <http://www.electronictimes.com/story/OEG20010719S0042>.

Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.

Cutting Edge Optronics, 600W QCW Laser Diode Array, Part No. ARR48P600, 2 pages, Oct. 2001, <www.ceolaser.com>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Deublin Company, "Rotating Unions", 1 page, retrieved from the Internet on Feb. 4, 2002, <http://www.com/products/rotatingunions.htm>.

Deublin Company, "Sealing," 2 pages, retrieved from the Internet on Feb. 4, 2002, <http://www.deublin.com/products/sealing.htm>.

EMCO Flow Systems, "Mach One Mass Flow Controller Product Brochure" 6 pages, retrieved from the Internet on Nov. 7, 2003, <http://www.emcoflow.com/literature/brochures_product_sheets/mach_one/mach_one_brochure_2_01.pdf>.

EMCO Flow Systems, "Mach One Mass Flow Controllers", 1 page, retrieved from the Internet on Nov. 7, 2003, <http://emcoflow.com/mach-one.htm>.

Engelke, F., et al., "Determination of Phenylthiohydantoin-Amino Acids by Two-Step Laser Desorption/Multiphoton Ionization," Analytical Chemistry, vol. 59, No. 6, pp. 909-912, Mar. 15, 1987, The American Chemical Society.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., "Microfluidic MEMS," Proceedings, IEEE Aerospace Conference, Paper 4.906 (IEEE Press, Piscataway, NJ, 1998), 16 pages.

Henning, A.K., et al., "A thermopneumatically actuated microvalve for liquid expansion and proportional control", Proceedings, Transducers '97: 1997 International Solid State Sensors and Actuators Conference, pp. 825-828.

Henning, A.K., et al., "Microfluidic MEMS for Semiconductor Processing," IEEE Trans. Components, Packaging, and Manufacturing Technology B21, pp. 329-337, 1998.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Integrated Process Systems Ltd., "ALD & CVD", 2 pages, retrieved from the internet on Dec. 11, 2001, <http://www.ips-tech.com/eng/pro-p2-2.htm>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Maillefer, D., et al., "A High-Performance Silicon Micropump for Disposable Drug Delivery Systems," pp. 413-417, IEEE, 2001.

Olsson, A., "Valve-less Diffuser Micropumps", ISSN 0281-2878, 66 pages, 1998.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

Ready, J.F., "Effects Due to Absorption of Laser Radiation," Journal of Applied Physics, vol. 36, No. 2, pp. 462-468, Feb. 1965, Journal of Applied Physics, American Institute of Physics.

SemiZone, EMCO Flow Systems Granted Patent for the Mach One Mass Flow Controller for the Semiconductor Industry (Jun. 28, 2001), 2 pages, retrieved from the Internet on Nov. 7, 2003, <http://www.semizone.com/news/item?news_item_id+100223>.

Takahashi, K. et al., "Process Integration of 3D Chip Stack with Vertical Interconnection," pp. 601-609, 2004 Electronic Components and Technology Conference, IEEE, Jun. 2004.

The University of Adelaide, Department of Chemistry, "Spectroscopy", 2 pages, retrieved from the Internet on Feb. 9, 2002, <http://www.chemistry.adelaide.edu.au/external/Soc-Rel/Content/spectros.htm>.

Tokyo Electron Limited, Plasma Process System, Trias SPA, 1 page, retrieved from the Internet on Oct. 16, 2004, <http://www.tel.com/eng/products/spe/sdtriasspa.htm>.

University of California, Berkeley, University Extension, "Atomic Layer Deposition," 5 pages, Sep. 24-25, 2001, <http://www.unex.berkeley.edu/eng/br225/1-1.html>.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

* cited by examiner

METHODS AND SYSTEMS FOR CONTROLLING TEMPERATURE DURING MICROFEATURE WORKPIECE PROCESSING, E.G. CVD DEPOSITION

This application is a divisional of U.S. patent application Ser. No. 10/733,523, filed Dec. 10, 2003, now U.S. Pat. No. 7,258,892 issued Aug. 21, 2007, which is incorporated herein by reference in its entirety.

TECHNICAL FIELD

The present invention is related to methods for processing microfeature workpieces, e.g., semiconductor wafers. Aspects of the invention have particular utility in connection with depositing thin layers of material on a microfeature workpiece, such as by atomic layer deposition or chemical vapor deposition.

BACKGROUND

Thin film deposition techniques are used in a variety of applications. One field where such techniques take on particular importance is in the manufacturing of microfeatures, which employ a thin coating on a workpiece that closely conforms to the surface topography. For example, such techniques may be used to deposit successive thin layers of capacitors used in DRAM memory cells. One thin film deposition technique widely used in the microelectronics industry is chemical vapor deposition (CVD). In a CVD system, one or more precursors that are capable of reacting to form a solid thin film are mixed in a gas or vapor state and this precursor mixture is presented to the surface of the workpiece. The surface of the workpiece catalyzes the reaction between the precursors to form a solid thin film on the workpiece surface.

A common way to catalyze the reaction at the surface of the workpiece is to heat the workpiece to a temperature that causes the reaction. For some CVD reactions, the deposition rate and the quality of the deposited layer are optimized in a relatively narrow band of temperatures. In addition, many semiconductor workpieces have a "heat budget" that reflects the cumulative adverse effects of elevated temperatures on the semiconductor substrate. Optimizing the deposition process while minimizing the impact on the heat budget requires relatively precise control over the temperature in the CVD process.

Although current temperature management techniques have proven acceptable in the deposition of common materials, e.g., silicon nitride and polycrystalline silicon (also referred to as "polysilicon"), newer microelectronic component designs are increasingly incorporating other materials in their designs. Some of these materials present significant manufacturing challenges. For example, some microfeature workpiece manufacturing processes require deposition of materials that are more reflective of radiant heat than the more conventional silicon nitride and polysilicon films. Batch CVD reactors used in manufacturing microelectronic components commonly heat the microfeature workpieces during the CVD process via radiant heat. For example, U.S. Patent Application Publication 2001/0029892, the entirety of which is incorporated herein by reference, illustrates a batch plasma enhanced CVD system in which a series of radiant heat panels are arranged around the outside of a deposition chamber. When depositing radiant heat-reflective materials on workpieces in such a CVD system, some of the material also will be deposited on an inner surface of the deposition chamber walls. This reflective layer reflects the heat that is intended to heat the workpieces, thereby reducing efficiency. Even more problematic, the reflective build-up on the deposition chamber walls causes a thermal lag between the delivery of power to the radiant heat source and an increase in the temperature in the chamber.

As illustrated in International Publication No. WO 02/073660, the entirety of which is incorporated herein by reference, some CVD reactors employ one or more inner thermocouples within the deposition chamber and one or more outer thermocouples outside the deposition chamber. The outer thermocouples tend to bear a more direct relationship to the energy being delivered by the heat source, and the inner thermocouples, in contrast, tend to more accurately indicate the temperature in the chamber. As a consequence, the outer thermocouples are usually used to control the heat source when ramping up the temperature to the intended deposition temperature. Once the workpieces are at the deposition temperature, control of the heat source is guided by the inner thermocouples to maintain the deposition temperature within an acceptable range during the deposition process. When depositing conventional materials such as polysilicon, the temperature reading of the inner thermocouples may lag the reading of the outer thermocouples somewhat, but this thermal lag tends to be fairly predictable and can be accounted for empirically in the control system.

Figure 1:
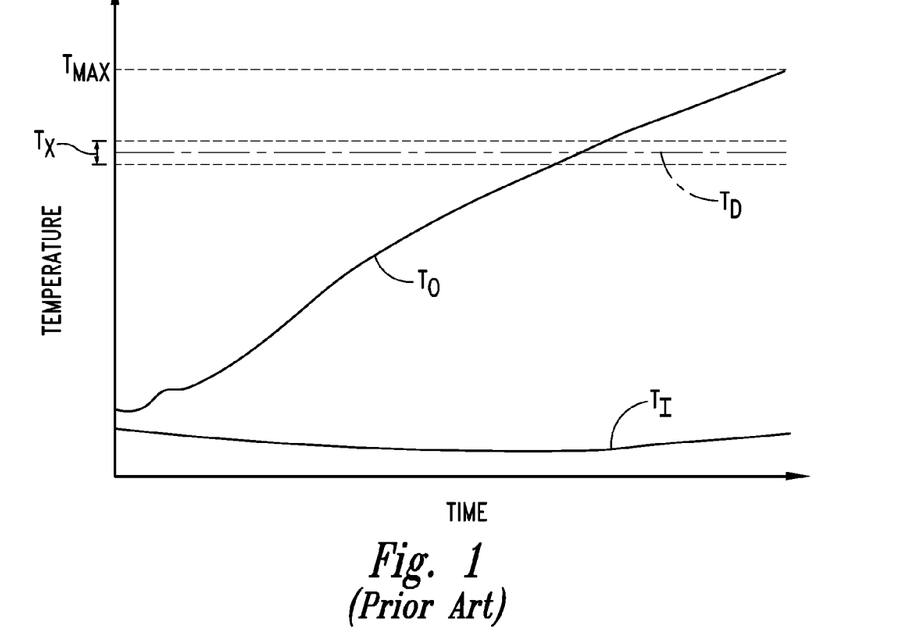
FIG. 1 is a schematic plot of temperature measured by inner and outer thermocouples as a function of time showing a significant thermal lag during a temperature ramp-up phase of a CVD process.

If a heat-reflective material is being deposited, however, deposition of the material on the chamber walls with successive workpieces reduces the percentage of the heat output actually reaching the interior of the deposition chamber. In addition, the heat reflected by the deposited material is directed back at the outer thermocouples and the heating elements, further increasing the thermal lag over time. One temperature control problem attributable to this increased thermal lag is illustrated schematically in FIG. 1. In FIG. 1, the temperature $T_O$ measured by one of the outer thermocouples increases significantly more quickly than the temperature $T_I$ measured by one of the inner thermocouples. As suggested in this schematic drawing, the temperature $T_O$ measured by the outer thermocouple may reach or exceed the intended deposition temperature $T_D$ before the temperature $T_I$ measured by the inner thermocouples begins to significantly increase. Delivering more power to the heaters to more rapidly heat the interior of the deposition chamber can heat the outer thermocouple and the radiant heat source to a maximum safe operating temperature $T_{MAX}$, causing the CVD system to abort the heating process to protect the heat source from damage.

Figure 2:
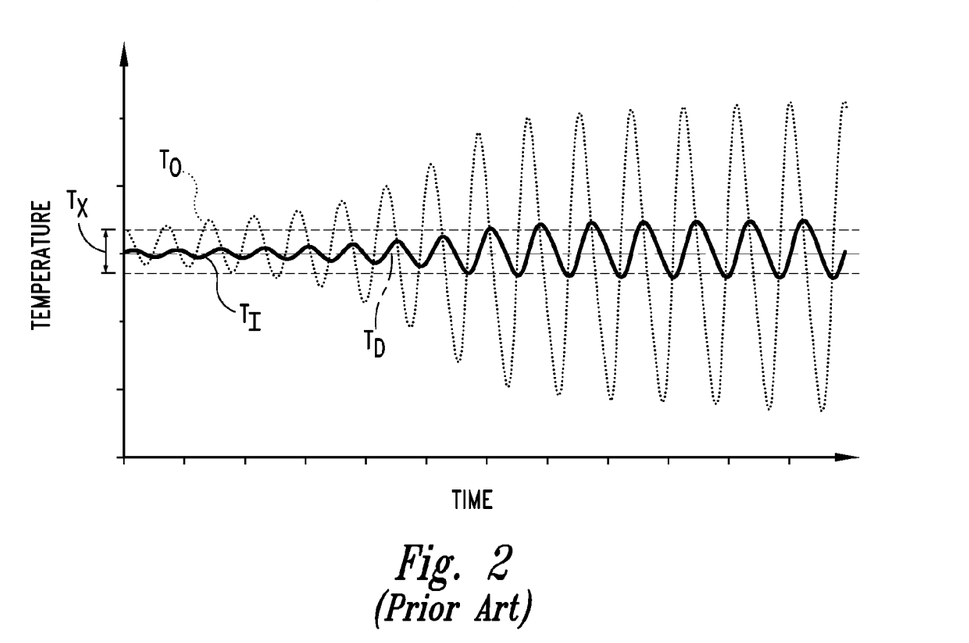
FIG. 2 is a graph schematically illustrating oscillations in the operating temperatures measured by inner and outer thermocouples during a deposition phase of a CVD process.

Even if the thermal lag is managed effectively when ramping up the temperature in the deposition chamber, the reflective layer on the wall of the deposition chamber makes it more difficult to maintain the temperature in the chamber at a constant level over time. As suggested in FIG. 2, the thermal lag induced by the increased reflectance can lead to significant oscillations in the temperature in the deposition chamber. When one of the inner thermocouples registers a temperature $T_I$ that falls below the targeted deposition temperature, power may be delivered to the heat source to bring the temperature back up. By the time the inner thermocouple reaches the target temperature again, the heat source has already delivered too much energy and the temperature in the chamber overshoots the target. To compensate, the heat source power is reduced to a level below that necessary to maintain the targeted temperature, which can again cause the temperature $T_I$ measured by the inner thermocouple to drop below the targeted temperature, starting the cycle again. This cycle can lead to temperature oscillations with increasing amplitude over time. As the process continues, the amplitude of the oscillations may equal or exceed the width of an acceptable deposition temperature range $T_x$, leading to suboptimal material deposition conditions.

One way to address these difficulties is to clean the deposition chamber to remove built-up material deposited on the walls of the chamber. This typically involves a plasma dry clean process and a subsequent seasoning of the chamber walls. Particularly for batch CVD systems, this cleaning process can be fairly time-consuming. This downtime significantly reduces the throughput of the CVD system.

DETAILED DESCRIPTION

A. Overview

Various embodiments of the present invention provide microfeature workpiece processing systems and methods for depositing materials onto microfeature workpieces. Many specific details of the invention are described below with reference to examples of systems for depositing materials onto microfeature workpieces. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 3-5 and the following text to provide a thorough understanding of particular embodiments of the invention. A person skilled in the art will understand, however, that the invention may have additional embodiments, or that the invention may be practiced without several of the details of the embodiments shown in FIGS. 3-5.

A method for controlling temperature in a deposition process in accordance with one embodiment of the invention includes positioning a microfeature workpiece in a deposition chamber, monitoring a first temperature from a first temperature sensor positioned outside the deposition chamber, and monitoring a second temperature from a second temperature sensor positioned in the deposition chamber. An internal temperature in the deposition chamber (e.g., the temperature of the microfeature workpiece) is increased from an initial temperature to a deposition temperature in accordance with a ramp profile by comparing a control temperature to a target temperature and selectively delivering heat to the deposition chamber in response to a result of the comparison. The control temperature in this method alternates between the first temperature and the second temperature. The target temperature is determined in accordance with the ramp profile.

Another embodiment of the invention provides a system for depositing a material on a microfeature workpiece. The system includes an enclosure, a heater, first and second temperature sensors, and a programmable controller. The enclosure defines a deposition chamber and the heater is adapted to deliver heat to the deposition chamber. The first temperature sensor is outside the deposition chamber and is adapted to generate a first temperature signal corresponding to a first temperature outside the deposition chamber. The second temperature sensor is in the deposition chamber and is adapted to generate a second temperature signal corresponding to a second temperature in the deposition chamber. The programmable controller is operatively coupled to the heater, the first temperature sensor, and the second temperature sensor. The controller is programmed to heat the microfeature workpiece from an initial temperature to a deposition temperature in accordance with a ramp profile by comparing a control temperature to a target temperature and controlling the heater to selectively deliver heat to the deposition chamber in response to the results of the comparison. The control temperature alternates between the first temperature and the second temperature. The target temperature is determined in accordance with the ramp profile.

A method for controlling temperature in a deposition process in accordance with a further embodiment of the invention may be initiated by positioning a microfeature workpiece in a deposition chamber of an enclosure. Both a first temperature and a second temperature may be monitored. The first temperature is from a temperature sensor positioned outside the deposition chamber and the second temperature is from a second temperature sensor positioned in the deposition chamber. A control temperature is alternated between the first temperature and the second temperature. A target temperature is varied in accordance with a ramp profile. The control temperature is compared to the target temperature and heat is selectively delivered to the deposition chamber in response to a result of this comparison.

Still another embodiment of the invention provides a method for depositing a material on a microfeature workpiece that includes positioning a microfeature workpiece in a deposition chamber of an enclosure, monitoring first and second temperatures, and maintaining a temperature of the microfeature workpiece. The first temperature is from a first temperature sensor positioned outside the deposition chamber and the second temperature is from a second temperature sensor positioned inside the deposition chamber. The microfeature workpiece is heated from an initial temperature to a deposition temperature in accordance with a ramp profile by comparing a target temperature with a first controlled temperature in a first comparison and controlling a heater in response to a result of the first comparison. The target temperature may be determined in accordance with the ramp profile and the first control temperature may alternate between the first and second temperatures. A second control temperature may be determined as a function (e.g., a weighted average) of both the first temperature and the second temperature. The temperature of the microfeature workpiece may be maintained within a deposition temperature range by comparing the deposition temperature with the second control temperature in a second comparison and controlling the heater in response to a result of the second comparison. In a further aspect of the invention, a precursor may be delivered to the deposition chamber while maintaining the temperature of the microfeature workpiece within the deposition temperature range to deposit a material on the microfeature workpiece and an inside surface of the wall of the enclosure.

For ease of understanding, the following discussion is subdivided into two areas of emphasis. The first section discusses aspects of processing systems that may be used in accordance with selected embodiments of the invention. The second section outlines methods in accordance with other aspects of the invention.

B. Processing Systems

Figure 3:
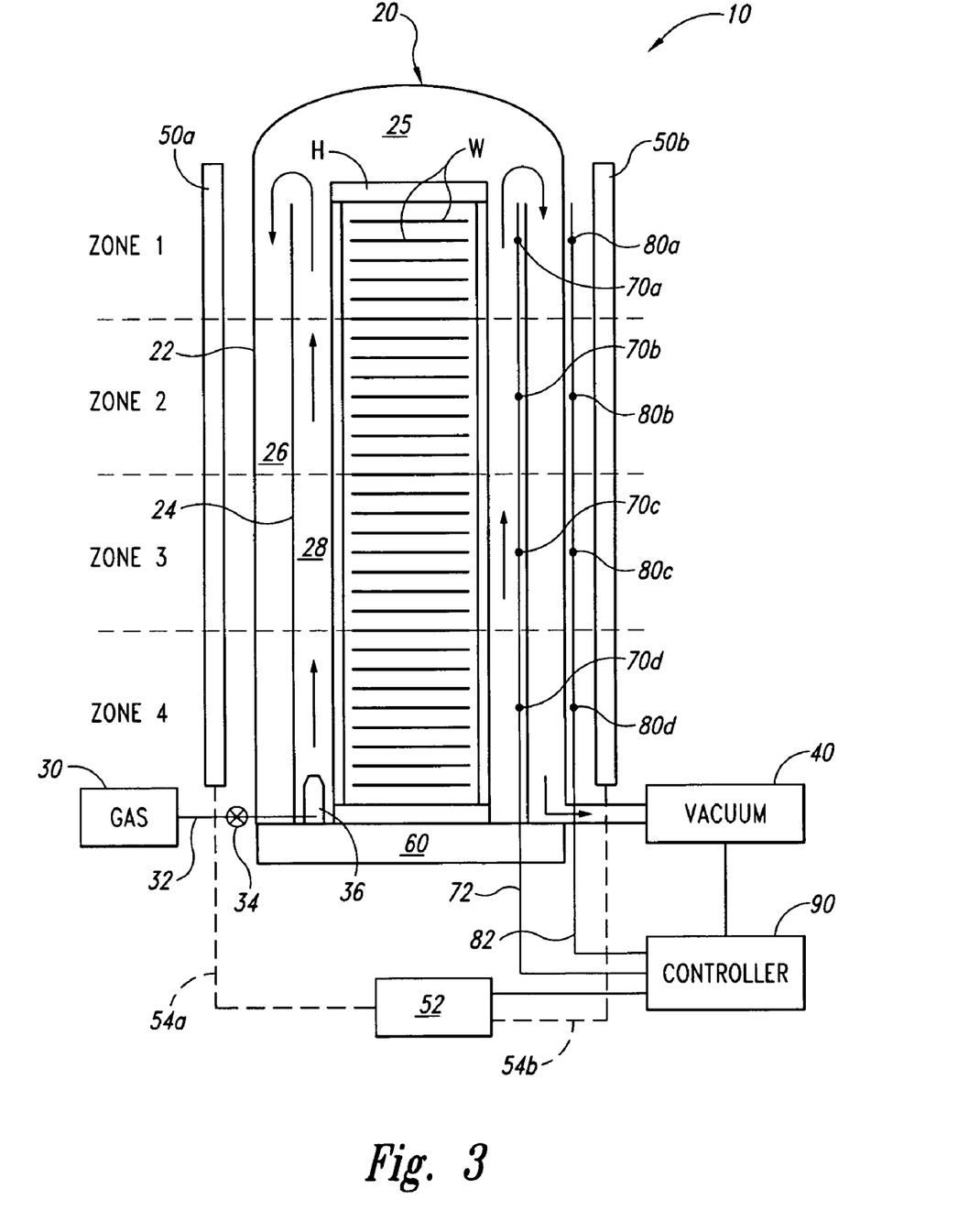
FIG. 3 is a schematic illustration of a system for depositing material on a microfeature workpiece in accordance with an embodiment of the invention.

FIG. 3 schematically illustrates a reactor 10 in accordance with one embodiment of the invention. This reactor 10 includes a processing enclosure 20 coupled to a gas supply 30 and a vacuum 40. The processing enclosure 20 generally includes an outer wall 22 and an annular liner 24. A platform 60 seals against the outer wall 22 or some other part of the processing enclosure 20 to define a deposition chamber 25. The liner 24 functionally divides the deposition chamber 25 into a main chamber 28 and an annular exhaust 26.

Gas is introduced from the gas supply 30 to the deposition chamber 25 by a gas line 32 and an inlet 36. The inlet 36 directs a flow of gas into the main chamber 28 of the deposition chamber 25. Under the influence of the vacuum 40, gas introduced via the gas inlet 36 will flow through the main chamber 28, outwardly into the annular exhaust 26, and out of the deposition chamber 25. A valve 34 in the gas line 32 may be operated by a controller 90 (described below) to deliver gases to the deposition chamber 25 during the deposition phase. Some aspects of the gas supply 30 will depend on the nature of the deposition process to be carried out in the reactor 10. If the reactor 10 is to carry out a CVD process employing multiple precursors, the gas supply 30 can include a plurality of separate gas sources (not shown) and the valve 34 may comprise a valve assembly having a plurality of valves. For example, the gas supply 30 may include one or more precursors capable of reacting to deposit a material that reflects radiant heat, e.g., titanium nitride. For example, the gas supply 30 may include a source of $TiCl_4$ and a source of $NH_3$, which may react to deposit TiN. In another example, the gas supply 30 may include a source of TDMAT and a nitrogen carrier gas, which may also be used to deposit TiN.

One or more workpieces W, e.g., semiconductor wafers, may be positioned in the deposition chamber 25 for processing. In the illustrated embodiment, a plurality of workpieces W is held in the processing enclosure 20 in a workpiece holder H. It should be understood that FIG. 3 is merely schematic in nature and any number of workpieces W (e.g., 20-250) may be held in the workpiece holder H for simultaneous batch processing.

The reactor 10 also includes at least one inner temperature sensor 70 positioned within the deposition chamber 25 and at least one outer temperature sensor 80 positioned outside the deposition chamber 25. The particular reactor 10 illustrated in FIG. 3 employs four inner temperature sensors 70a-d and four outer temperature sensors 80a-d. In one embodiment, the temperature sensors 70 and 80 are thermocouples. Signals from the inner temperature sensors 70a-d may be communicated to the controller 90 via a first temperature signal line 72 and temperature signals from the outer temperature sensors 80a-d may be delivered to the controller 90 by a second temperature signal line 82.

The reactor 10 also includes at least one heat source to heat the workpieces W and maintain them at the desired temperature. The heat source in FIG. 3 is typified as a first radiant heater 50a positioned outside the deposition chamber 25 on one side of the processing enclosure 20 and a second radiant heater 50b positioned outside the deposition chamber 25 on the other side of the enclosure 20. These heaters 50a-b may comprise quartz-halogen lamps or other types of radiative heat sources. Such lamps are well-known in the art and commercially available from a wide variety of sources. Although not shown in the schematic view of FIG. 3, a series of these heaters 50 may be arranged about a circumference of the enclosure 20 to evenly heat the workpieces W. (See, e.g., the radiant heat panels suggested in U.S. Patent Application Publication 2001/0029892, discussed above.) The heaters 50 may be coupled to a common power supply 52 by a series of power lines. Hence, heater 50a is coupled to the power source 52 via a first power line 54a and the second heater 50b is coupled to the power source 52 by a second power line 54b.

To reduce temperature variations along a length of the deposition chamber 25, the heaters 50 may be divided into a series of zones, with each zone being controlled separately. In the embodiment shown in FIG. 3, a first inner temperature sensor 70a and a first outer temperature sensor 80a may be associated with a first zone (Zone 1), a second inner temperature sensor 70b and a second outer temperature sensor 80b may be associated with a second zone (Zone 2), a third inner temperature sensor 70c and a third outer temperature sensor 80c may be associated with a third heating zone (Zone 3), and a fourth inner temperature sensor 70d and a fourth outer temperature sensor 80d may be associated with a fourth heating zone (Zone 4).

As noted above, the controller 90 may be coupled to the valve 34 of the gas supply 30, the vacuum 40, the power supply 52 of the heater 50, and the temperature sensors 70a-d and 80a-d. In one embodiment, the controller 90 comprises at least one computer having a programmable processor programmed to control operation of these components to deposit material on the workpiece W. In particular, the controller 90 may be programmed to operate the heaters 50 to control temperature in accordance with the methods outlined below.

C. Methods for Depositing a Material on a Microfeature Workpiece

As noted above, other embodiments of the invention provide methods of depositing a material on a workpiece W and methods of controlling temperature in a deposition process. In the following discussion, reference is made to the reactor 10 shown schematically in FIG. 3. It should be understood, though, that reference to this particular reactor is solely for purposes of illustration and that the methods outlined below are not limited to any particular processing system shown in the drawings or discussed in detail above.

Embodiments of the present invention provide methods for controlling a temperature during a ramp-up phase of a deposition process. Other embodiments of the invention are particularly useful in maintaining a deposition temperature within a deposition temperature range in a manner that is expected to dampen or eliminate the oscillation pattern illustrated in FIG. 3

In select embodiments, operation of the heaters 50 during a ramp-up phase may be controlled on the basis of a control temperature that alternates between a temperature from one of the inner temperature sensors 70 and a temperature from an associated one of the outer temperature sensors 80. In one embodiment, the controller 90 may use the temperature from the outer temperature sensor 80 as the control temperature for a first period of time ($t_1$) and use the temperature from the inner temperature sensor 70 as the control temperature for a second period of time ($t_2$). This process can be repeated at least as long as needed to complete the ramp-up phase. In one embodiment, each zone of the heaters 50a-b is separately controlled by alternating between the inner and outer temperature sensors for the zone. Hence, control of Zone 1 of the heaters 50a-b, for example, may be based on a control signal that alternates between a temperature from the first inner temperature sensor 70a (referred to generically as the inner temperature sensor 70 in the following discussion) and a temperature from the first outer temperature sensor 80a (referred to generically as the outer temperature sensor 80 in the following discussion).

Figure 4:
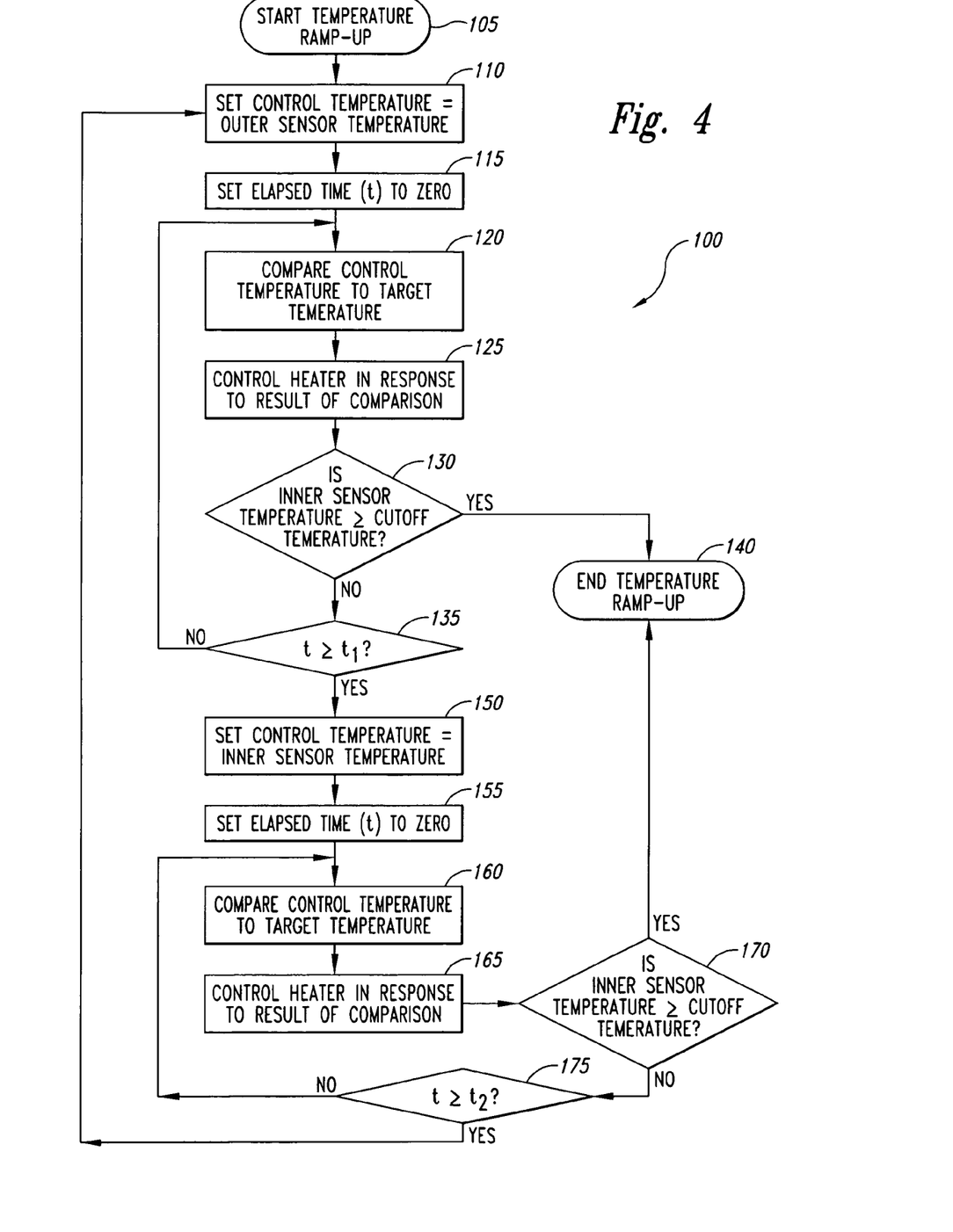
FIG. 4 is a flow diagram schematically illustrating a temperature ramp-up process in accordance with another embodiment of the invention.

FIG. 4 schematically illustrates one particular temperature ramp-up process 100 employing a control temperature that alternates between a temperature from an inner temperature sensor 70 and a temperature from an outer temperature sensor 80. Once the workpieces W are loaded in the deposition chamber 25 and the deposition chamber 25 is sealed, the controller 90 may begin the ramp-up process 100 by starting the temperature ramp-up in operation 105. At this point, the workpieces W will be at an initial temperature, which may be greater than room temperature. The controller 90 may then set the control temperature equal to the temperature from one of the temperature sensors 70 and 80. In the particular embodiment illustrated in FIG. 4, the controller 90 initially sets the control temperature equal to the temperature measured by the outer temperature sensor 80 in operation 110. The controller 90 may also initialize an elapsed time counter by setting it to zero in operation 115.

In operation 120, the control temperature (which is currently equal to the temperature from the outer temperature sensor 80) is compared to a target temperature correlated to the ramp profile. The target temperature is defined according to a predetermined ramp profile for the specific deposition process. In process 125, the controller 90 may then control the heaters 50 (e.g., via the heater power supply 52) in response to the result of the comparison in process 120. The algorithm for determining the appropriate power levels delivered to the heaters 50 can be varied as necessary to match empirically observed behavior for the particular reactor 10 being employed.

In process 130 of the ramp-up process 100, the controller 90 may compare the temperature from the inner temperature sensor 70 to a preprogrammed cutoff temperature. The cutoff temperature may be selected to bring the temperature in the deposition chamber 25 to the desired deposition temperature ($T_D$ in FIGS. 1 and 2) without overshooting the targeted deposition temperature range $T_x$. As will be understood by those skilled in the art, this cutoff temperature can be determined empirically for any particular combination of workpieces and reactor 10. If the temperature from the inner temperature sensor 70 is determined in process 130 to be greater than or equal to the cutoff temperature, the process will proceed to the end of the temperature ramp-up (process 140) and the ramp-up process 100 will be completed.

If the temperature reading of the inner temperature sensor 70 is less than the cutoff temperature, the controller 90 may determine whether the elapsed time t, which was set to zero in process 115, is equal to or greater than a first fixed time period $t_1$ (e.g., ten minutes). If the elapsed time t is less than the fixed time period $t_1$, processes 120-130 may be continued until the elapsed time t equals or exceeds the fixed time period $t_1$.

If the elapsed time t exceeds the predetermined time period $t_1$ in process 135, the control temperature may be set in process 150 to the temperature from the inner temperature sensor 70 instead of the outer temperature sensor 80 and the elapsed time may be reset to zero in process 155. In a manner directly analogous to processes 120-130, the controller 90 may compare the control temperature (now equal to the temperature from the inner temperature sensor 70) to the target temperature (process 160) and control the heaters 50 in response to the result of that comparison (process 165). In process 170, the controller again determines whether the temperature from the inner temperature sensor 70 (which in this case coincides with the control temperature) is equal to or greater than the cutoff temperature. If it is, the ramp-up process 100 terminates at process 140.

If the temperature from the inner temperature sensor 70 is less than the cutoff temperature, the controller 90 determines in process 175 whether the elapsed time t is equal to or greater than a second fixed period of time $t_2$ (e.g., about two minutes). If the elapsed time t is less than the time $t_2$ allotted for control based on the temperature from the inner temperature sensor 70, processes 160-170 will be repeated until the elapsed time t is equal to or greater than the second fixed time period $t_2$.

If the temperature from the inner temperature sensor 70 is still less than the cutoff temperature when the full time period $t_2$ has elapsed, the process 100 returns to process 110, setting the control temperature back to the temperature from the outer temperature sensor 80. The process 100 will continue repeating processes 110-135 and 150-175 until the temperature from the inner temperature sensor 70 equals or exceeds the cutoff temperature and the process terminates at process 140.

The process 100 illustrated in FIG. 4 relies on the passage of fixed periods of time ($t_1$ and $t_2$) to determine when to switch the control temperature to the outer sensor temperature or the inner temperature sensor. In an alternative embodiment, this determination may be based at least in part on temperature instead of time.

As noted above, when the controller is relying on the inner temperature sensors for the control temperature, more power is typically delivered to the heaters 50, which may cause the heaters 50 to overheat. If the decision in process 175 to switch from the inner sensor temperature to the outer sensor temperature is based on time. In another embodiment, process 175 may instead compare the outer sensor temperature to a preset trigger temperature. When the outer sensor temperature reaches or exceeds this trigger temperature, the control temperature may be switched to the outer sensor temperature in process 110. This should further reduce the likelihood that the heaters 50 will exceed a maximum safe operating temperature and prematurely terminate the ramp-up process 100.

In another embodiment, both the decision to switch the control temperature from the outer sensor temperature to the inner sensor temperature and the decision to switch the control temperature from the inner sensor temperature to the outer sensor temperature may be based on temperature instead of time. In such an embodiment, process 135 in FIG. 4 would compare the inner sensor temperature to a previously determined first trigger temperature. If the inner sensor temperature is at least as great as the trigger temperature, the control temperature will be set to the inner sensor temperature in process 150. The control temperature would be switched from the inner sensor temperature to the outer sensor temperature once the outer sensor temperature reached or exceeded a second trigger temperature in process 175. If so desired, one or both of these trigger temperatures may be selected (empirically or otherwise) to increase as the target temperature increases. In one particular embodiment, the first trigger temperature, which is tied to the inner sensor temperature, may increase over the course of the ramp-up process 100 while the second trigger temperature, which is based on the outer sensor temperature, may remain constant over the course of the temperature ramp-up process 100.

Figure 5:
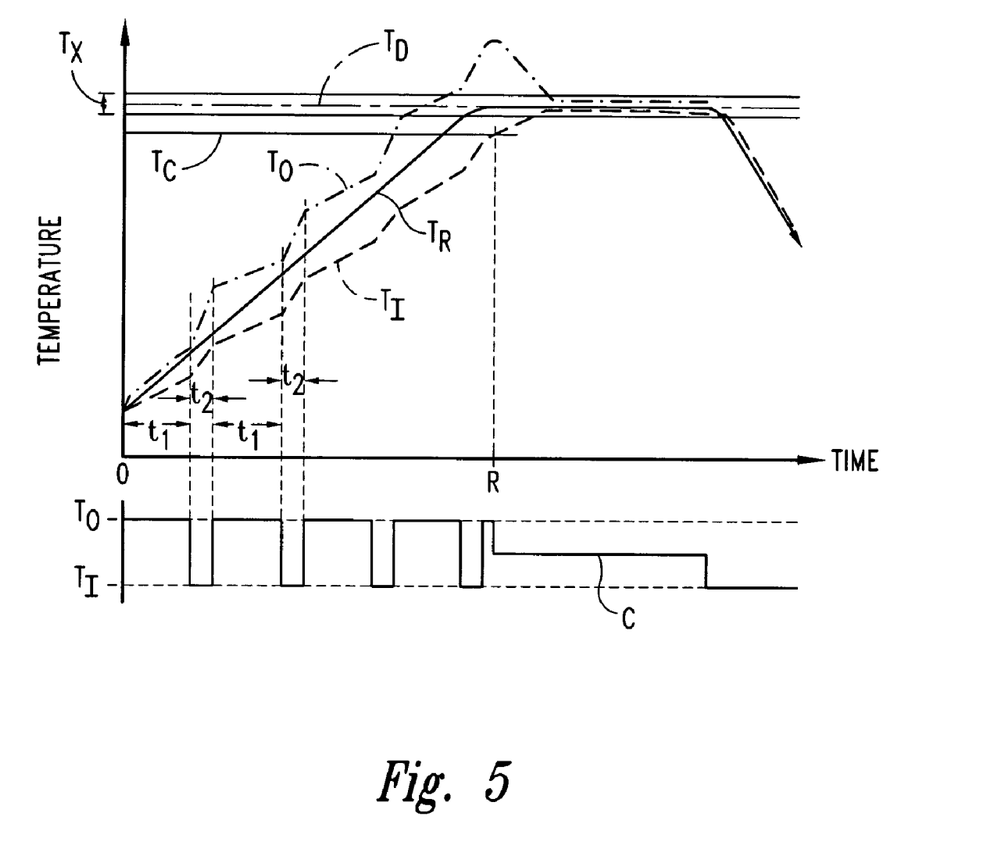
FIG. 5 is a graph schematically illustrating aspects of a method of depositing material on microfeature workpieces in accordance with other embodiments of the invention.

FIG. 5 schematically illustrates a temperature profile that may result, in part, from the ramp-up process 100 outlined in FIG. 4. The upper graph of FIG. 5 illustrates the temperature $T_O$ measured by the outer temperature sensor 80 (the dashed and dotted upper curve) and the temperature $T_I$ measured by the inner temperature sensor 70 (the dashed lower curve) as a function of time. This upper graph also indicates the temperature $T_R$ of the ramp profile as a function of time. The bottom graph of FIG. 5 is a schematic plot of the origin of the control temperature C as a function of time. The time scale in both graphs of FIG. 5 is the same. Initially, the temperature from the outer temperature sensor 80 is used as the control temperature C. After the appropriate fixed time period $t_1$ has elapsed (process 135 in FIG. 4), the temperature from the inner temperature sensor 70 is used as the control temperature C for the appropriate second time period of time $t_2$. This process continues, with the control temperature C alternating between the outer temperature sensor 80 and the inner temperature sensor 70 until the controller 90 determines that the inner temperature sensor 70 reaches or exceeds the cutoff temperature $T_C$ (process 130 or process 170 of FIG. 4). At this time, designated R in FIG. 5, the ramp-up process 100 of FIG. 4 terminates at process 140.

The ramp-up process 100 illustrated in FIG. 4 may be used in a variety of contexts. This process is expected to have particular utility in connection with the deposition of radiant heat-reflective materials in a CVD process employing radiant heat as a heat source. As noted above in connection with FIG. 1, the material being deposited on the workpieces W will also tend to build up on the inner surface of the deposition chamber. In the reactor 10 of FIG. 3, this material may be deposited on the inner surface of the liner 24 and/or on the inner surface of the outer wall 22 of the processing enclosure 20. Both the outer wall 22 and the liner 24 are disposed between the radiant heaters 50 and the workpieces W. As the heat-reflective material builds in processing successive microfeature workpieces W, the reflectivity of this built-up coating will increase. This increases the thermal lag, which experience has demonstrated can subject the outer temperature sensor 80 and the heaters 50 to quite significant temperature spikes before the temperature $T_I$ measured by the inner temperature sensor 70 reaches the intended deposition temperature $T_D$.

The ramp-up process 100 of FIG. 4 helps bypass this temperature lag by controlling the heaters 50 based on the temperature $T_O$ measured by the outer temperature sensor 80 for part of the time and controlling the heaters 50 based on the temperature $T_I$ measured by the inner temperature sensor 70 during another part of the time. While the controller 90 is relying on the outer temperature sensor 80, the temperature $T_I$ measured by the inner temperature sensor 70 may increase at an undesirably slow rate. As a consequence, when the controller 90 switches the control temperature C to the inner temperature sensor 70, the control temperature C reflects a temperature that is appreciably below the desired ramp temperature $T_R$. The controller 90, therefore, delivers more power to the heaters 50, significantly increasing the rate at which the temperatures measured by both the inner and outer temperature sensors 70 and 80 increases. When the controller 90 switches the control temperature C back to the outer temperature sensor 80, this outer temperature $T_O$ may be considerably higher than the inner temperature $T_I$. Consequently, the controller 90 will reduce the power delivered to the heaters 50, allowing the temperature $T_O$ of the outer temperature sensor 80 to stabilize. Switching the control temperature C back and forth in this fashion is expected to significantly ameliorate the difficulties during temperature ramp-up for CVD reactors depositing heat-reflective materials.

FIG. 5 schematically illustrates an aspect of a further embodiment of the invention. In particular, the controller 90 may define the control temperature C as a function of both the temperature from the inner temperature sensor 70 and the temperature from the outer temperature sensor 80 instead of alternating between these two sensor temperatures. In one embodiment, this function comprises a mean of the temperatures indicated by the inner temperature sensor 70 and the outer temperature sensor 80. In another embodiment, this function is instead a weighted average of the temperatures from the inner and outer temperature sensors 70 and 80. For example, the temperature from the inner temperature sensor 70 may be given greater weight than the temperature from the outer temperature sensor 80. Taking into consideration the input from the inner temperature sensor 70 and the outer temperature sensor 80 is expected to dampen the temperature oscillations encountered with reflective material deposition outlined above in connection with FIG. 2.

The relative periods of time during which the control temperature C is tied to each of the inner and outer temperature sensors 70 and 80 can be varied as desired. If the time $t_2$ during which the controller 90 relies on the inner temperature sensor 70 is too long, the temperature $T_O$ measured by the outer temperature sensor 80 may exceed a permissible operational range of the heaters 50. This may invoke the safety features of the reactor 10 and shut down the heaters 50. Accordingly, this time period $t_2$ may be selected to maintain the temperature $T_O$ of the outer temperature sensor 80 within a permissible operational range. The time during which the controller 90 relies on the temperature from the outer temperature sensor 80 can allow the heaters 50 to stabilize to avoid overheating. In one exemplary embodiment, for example, each of the first time periods $t_1$ during which the control temperature C is set to the temperature from the outer temperature sensor 80 may be about ten minutes and the fixed time period $t_2$ during which the control temperature C is based on the temperature from the inner temperature sensor 70 may be about 20 percent as long, e.g., about two minutes.

When the deposition of material on the workpieces W is completed, the workpieces W may be allowed to cool from the deposition temperature $T_D$ to a lower terminal temperature. The platform 60 may then be lowered and the workpieces W may be removed from the processing enclosure 20.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas steps are presented in a given order, alternative embodiments may perform steps in a different order. The various embodiments described herein can be combined to provide further embodiments.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Use of the word "or" in the claims in reference to a list of items is intended to cover (a)

any of the items in the list, (b) all of the items in the list, and (c) any combination of the items in the list.

In general, the terms used in the following claims should not be construed to limit the invention to the specific embodiments disclosed in the specification unless the above-detailed description explicitly defines such terms. While certain aspects of the invention are presented below in certain claim forms, the inventors contemplate various aspects of the invention in any number of claim forms. Accordingly, the inventors reserve the right to add additional claims after filing the application to pursue such additional claim forms for other aspects of the invention.

The invention claimed is:

1. A system for depositing a material on a microfeature workpiece, comprising:
    an enclosure defining a deposition chamber;
    a heater adapted to deliver heat to the deposition chamber;
    a first temperature sensor outside the deposition chamber adapted to generate a first temperature signal corresponding to a first temperature outside the deposition chamber;
    a second temperature sensor in the deposition chamber adapted to generate a second temperature signal corresponding to a second temperature in the deposition chamber; and
    a programmable controller operatively coupled to the heater, the first temperature sensor, and the second temperature sensor, the controller being programmed to heat the microfeature workpiece from an initial temperature to a deposition temperature in accordance with a ramp profile by (a) comparing a control temperature to a target temperature, the target temperature being determined in accordance with the ramp profile, and (b) controlling the heater to selectively deliver heat to the deposition chamber in response to a result of the comparison between the control temperature and the target temperature, the control temperature alternating between the first temperature and the second temperature.

2. The system of claim 1 wherein the controller sets the control temperature equivalent to the first temperature for a first period of time and sets the control temperature equivalent to the second temperature for a second period of time.

3. The system of claim 2 wherein the second period of time is selected to maintain the first temperature within a permissible operational range.

4. The system of claim 1 wherein the controller sets the control temperature equivalent to the first temperature for a first period of time, sets the control temperature equivalent to the second temperature for a second period of time, sets the control temperature equivalent to the first temperature for a third period of time, and sets the control temperature equivalent to the second temperature for a fourth period of time, each of the first and third periods of time being different from both the second period of time and the fourth period of time.

5. The system of claim 1 wherein the controller switches the control temperature from the second temperature to the first temperature when the first temperature reaches or exceeds a trigger temperature.

6. The system of claim 1 wherein the controller switches the control temperature from the first temperature to the second temperature when the second temperature reaches or exceeds a first trigger temperature, and switches the control temperature from the second temperature to the first temperature when the first temperature reaches or exceeds a second trigger temperature.

7. The system of claim 1 wherein the controller switches the control temperature from the first temperature to the second temperature after a fixed period of time and the controller switches the control temperature from the second temperature to the first temperature when the first temperature reaches or exceeds a trigger temperature.

8. The system of claim 1 wherein the control temperature is a first control temperature, the controller being further programmed to hold a temperature of the microfeature workpiece in a deposition temperature range, which encompasses the deposition temperature, during a deposition phase by:
    determining a second control temperature as a function of both the first temperature and the second temperature;
    comparing the second control temperature with the deposition temperature in a second comparison; and
    controlling the heater in response to a result of the second comparison.

9. A system for depositing a material on a microfeature workpiece, comprising:
    a deposition chamber;
    a heat source outside of the deposition chamber, the heat source being configured to supply radiant heat to the deposition chamber;
    a first temperature sensor outside the deposition chamber that measures a first temperature, wherein the first temperature sensor is between the heat source and the deposition chamber;
    a second temperature sensor inside the deposition chamber that measures a second temperature; and
    a programmable controller operatively coupled to the heater, the first temperature sensor, and the second temperature sensor, the controller being programmed to heat the microfeature workpiece from an initial temperature to a deposition temperature in accordance with a ramp profile by (a) comparing a control temperature to a target temperature, the target temperature being determined in accordance with the ramp profile, and (b) controlling the heater to selectively deliver heat to the deposition chamber in response to a result of the comparison between the control temperature and the target temperature, the control temperature alternating between the first temperature and the second temperature.

10. The system of claim 9 wherein the control temperature is a first control temperature, the method performed by the controller further comprising holding the internal temperature of the deposition chamber in a deposition temperature range, which encompasses the deposition temperature, during a deposition phase by:
    determining a second control temperature as a function of both the first temperature and the second temperature; and
    selectively delivering heat to the deposition chamber in response to a result of a comparison of the second control temperature with the deposition temperature.

11. The system of claim 9 wherein the controller sets the control temperature equivalent to the first temperature for a first period of time and sets the control temperature equivalent to the second temperature for a second period of time, the first period of time being longer than the second period of time.

12. The system of claim 9 wherein the controller switches the control temperature from the second temperature to the first temperature when the first temperature reaches or exceeds a trigger temperature.

13. The system of claim 9 wherein the controller switches the control temperature from the first temperature to the second temperature when the second temperature reaches or exceeds a first trigger temperature, switches the control temperature from the second temperature to the first temperature when the first temperature reaches or exceeds a second trigger temperature, switches the control temperature from the first temperature to the second temperature when the second temperature reaches or exceeds a third trigger temperature, and switches the control temperature from the second temperature to the first temperature when the first temperature reaches or exceeds a fourth trigger temperature, wherein the second trigger is temperature is different from the fourth trigger temperature.

* * * * *

UNITED STATES PATENT AND TRADEMARK OFFICE
CERTIFICATE OF CORRECTION

PATENT NO. : 7,771,537 B2  Page 1 of 1
APPLICATION NO. : 11/418337
DATED : August 10, 2010
INVENTOR(S) : Kevin L. Beaman et al.

It is certified that error appears in the above-identified patent and that said Letters Patent is hereby corrected as shown below:

On the title page, in Item (54), in "Title", line 4, delete "E.G." and insert -- E.G., -- therefor.

In column 1, line 4, delete "E.G." and insert -- E.G., -- therefor.

Signed and Sealed this

Second Day of November, 2010

David J. Kappos
*Director of the United States Patent and Trademark Office*